(12) United States Patent
Coker

(10) Patent No.: US 7,173,845 B2
(45) Date of Patent: Feb. 6, 2007

(54) USER RAM FLASH CLEAR

(75) Inventor: Thomas Allyn Coker, Irving, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 195 days.

(21) Appl. No.: 10/788,581

(22) Filed: Feb. 27, 2004

(65) Prior Publication Data

US 2004/0223362 A1  Nov. 11, 2004

Related U.S. Application Data

(60) Provisional application No. 60/469,282, filed on May 9, 2003.

(51) Int. Cl.
  *G11C 11/00* (2006.01)
  *G11C 7/00* (2006.01)

(52) U.S. Cl. .................. 365/154; 365/156; 365/227; 365/230.06; 365/236

(58) Field of Classification Search ............. 365/154, 365/156, 185.04, 185.07, 185.33, 188, 213, 365/239, 226, 227, 230.06, 236
See application file for complete search history.

(56) References Cited

U.S. PATENT DOCUMENTS

| | | | |
|---|---|---|---|
| 5,047,985 A | | 9/1991 | Miyaji et al. |
| 5,159,571 A | * | 10/1992 | Ito et al. .................. 365/201 |
| 5,226,011 A | | 7/1993 | Yanagisawa |
| 5,276,647 A | | 1/1994 | Matsui et al. |
| 5,297,094 A | * | 3/1994 | Rastegar .................. 365/210 |
| 5,311,477 A | * | 5/1994 | Rastegar ............... 365/230.05 |
| 5,373,466 A | * | 12/1994 | Landeta et al. ......... 365/189.01 |
| 5,668,770 A | | 9/1997 | Itoh et al. |
| 5,774,411 A | * | 6/1998 | Hsieh et al. ........... 365/230.06 |
| 5,781,482 A | | 7/1998 | Sakata |
| 5,991,207 A | | 11/1999 | Sedlak et al. |
| 6,041,003 A | | 3/2000 | Casper et al. |
| 6,157,578 A | | 12/2000 | Brady |
| 6,469,930 B1 | | 10/2002 | Murray |
| 6,724,648 B2 | | 4/2004 | Khellah et al. |

(Continued)

*Primary Examiner*—Son T. Dinh
(74) *Attorney, Agent, or Firm*—Lisa K. Jorgenson; Andre M. Szuwalski

(57) ABSTRACT

A memory cell includes first and second p-channel transistors and first and second n-channel transistors in a cross-coupled latch configuration. Power control circuitry associated with the memory cell is coupled to selectively perform voltage transitions on the source terminals of one or more of the n-channel and/or p-channel transistors in the memory cell during a data corruption mode of operation to destroy data stored in the latch and set the memory cell to a known state. In one implementation, the power control circuitry is coupled to the source terminal of one of the n-channel transistors to transition that terminal from a low voltage reference level (present during a normal mode of operation) to a high voltage reference level and back to the low voltage reference level. In another implementation, the power control circuitry is coupled to the source terminal of one of the n-channel transistors and the source terminal of at least one of the p-channel transistors. The power control circuitry a) transitions the p-channel source terminal from a high voltage reference level (present during a normal mode of operation) to a low voltage reference level and back to the high voltage reference level, and b) transitions the n-channel source terminal from a low voltage reference level (present during a normal mode of operation) to a high voltage reference level and back to the low voltage reference level.

19 Claims, 4 Drawing Sheets

U.S. PATENT DOCUMENTS 6,963,499 B2* 11/2005 Rimondi et al. ............ 365/154
2002/0016914 A1   2/2002 Seki et al.
2004/0223362 A1  11/2004 Coker

* cited by examiner

USER RAM FLASH CLEAR

PRIORITY CLAIM

The present application claims priority from United States Provisional Application for Patent No. 60/469,282 filed May 9, 2003, the disclosure of which is hereby incorporated by reference.

BACKGROUND OF THE INVENTION

1. Technical Field of the Invention

The present invention relates to devices which include volatile memory cells and, more particularly, to circuitry for corrupting the data values stored in such a memory.

2. Description of Related Art

A commonly used structure for a volatile memory cell comprises the well known 6T memory cell. A conventional 6T memory cell structure is shown in FIG. 1. The 6T cell comprises a four transistors 10, 12, 14 and 16 arranged in a cross-coupled latch 18 configuration with two access transistors (pass gates) 20 and 22 connected thereto for allowing bit line (BL and BLC) access to the latched complementary logic values (at nodes T and C) stored by the latch.

Volatile memory cells are utilized in a number of different applications to store data. It is not uncommon for such memory cells to be used in secure applications such as in a smart card (see, FIG. 2) in order to store user and account related data. It is critically important to protect the security of that stored data. To that end, a need exists in the art to destroy or corrupt the stored data in response to detection of a tamper situation (such as, for example, when an unauthorized individual attempts to access the memory cells).

SUMMARY OF THE INVENTION

In accordance with one embodiment of the present invention, an integrated circuit includes at least one memory cell having first and second p-channel transistors and first and second n-channel transistors in a cross-coupled latch configuration. The circuit further includes power control circuitry coupled to a source terminal of one of the n-channel transistors for providing to that source terminal a low voltage reference level during a normal mode of operation and transitioning that source terminal voltage to a high voltage reference level and back to the low voltage reference level during a data corruption mode of operation.

In a further embodiment of the invention, a memory device includes a plurality of memory cells, the plurality of memory cells arranged in a plurality of groups, and the power control circuitry operating to perform voltage transitions on the memory cell source terminals one group of memory cells at a time.

In accordance with another embodiment of the present invention, an integrated circuit includes at least one memory cell having first and second p-channel transistors and first and second n-channel transistors in a cross-coupled latch configuration. The circuit further includes power control circuitry a) coupled to a source terminal of at least one of the p-channel transistors for providing to that source terminal a high voltage reference level during a normal mode of operation and transitioning that source terminal voltage to a low voltage reference level and back to the high voltage reference level during a data corruption mode of operation; and b) coupled to a source terminal of one of the n-channel transistors for providing to that source terminal the low voltage reference level during the normal mode of operation and transitioning that source terminal voltage to the high voltage reference level and back to the low voltage reference level during a data corruption mode of operation.

In accordance with a further embodiment of the invention, the voltage transitions on the source terminal of the at least one p-channel transistor are interleaved with the voltage transitions on the source terminal of the n-channel transistor.

In accordance with an embodiment of the present invention, a method for clearing a volatile memory comprises transitioning a low voltage reference terminal for a memory cell from a low reference voltage associated with a normal mode of operation to a high reference voltage in a data corruption mode of operation. The method further includes transitioning the low voltage reference terminal from the high reference voltage back to the low reference voltage.

In a further embodiment of the invention, a memory device includes a plurality of memory cells, the plurality of memory cells arranged in a plurality of groups, and the method performs voltage transitions on the memory cell source terminals one group of memory cells at a time.

In accordance with another embodiment of the present invention, a method for clearing a volatile memory comprises:

a) transitioning a high voltage reference terminal for a memory cell from a high reference voltage associated with a normal mode of operation to a low reference voltage in a data corruption mode of operation, and then returning the high voltage reference terminal back to the high reference voltage; and b) transitioning a low voltage reference terminal for the memory cell from the low reference voltage associated with the normal mode of operation to the high reference voltage in a data corruption mode of operation, and then returning the low voltage reference terminal back to the low reference voltage.

In still another embodiment of the present invention, the voltage transitions on the high voltage reference terminal of the memory cell are interleaved with the voltage transitions on the low voltage reference terminal of that memory cell.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Although embodiments of the present invention are illustrated in the context of an exemplary 6T cell, it will be recognized by those skilled in the art that these embodiments may be used with other types of memory cells.

Destroying the stored data in response to a detected tamper situation may comprise clearing the memory cells so that they enter unknown logical states. Even more preferred is a clearing operation which forces each of the memory cells to enter a certain known or fixed state. For example, all "1" or all "0" or a certain pattern.

Figure 1:
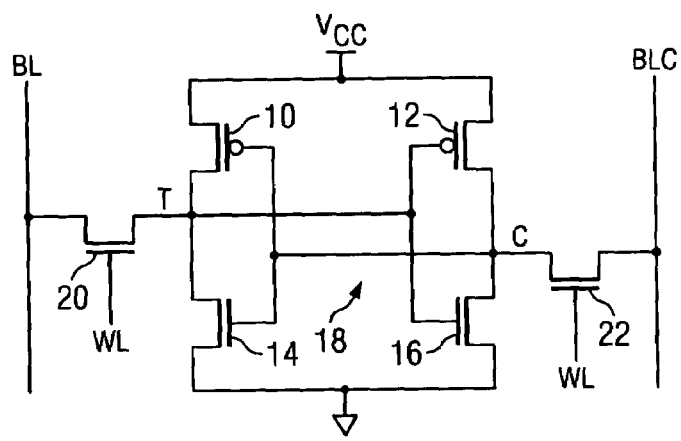
FIG. 1 is a schematic diagram of a prior art 6T memory cell.
Figure 2:
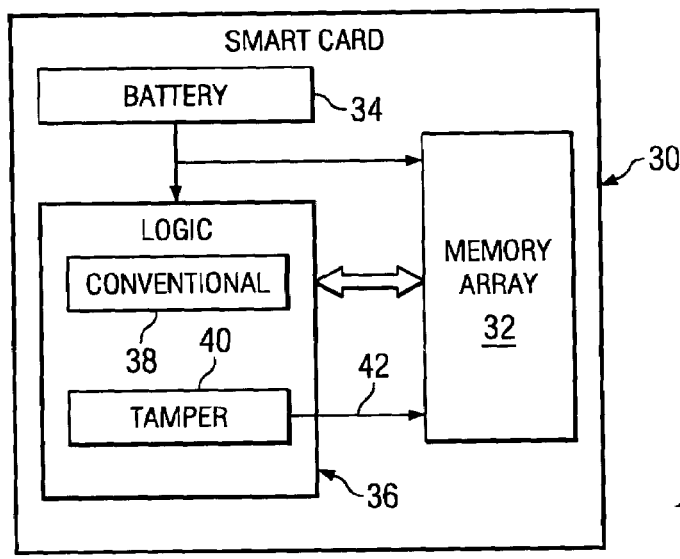
FIG. 2 is a block diagram of a smart card.

Reference is now made to FIG. 2 which illustrates a block diagram of a smart card 30 which includes a memory array/device 32 comprised of a plurality of volatile memory cells (for example, cells of the 6T type shown in FIG. 1), an internal battery/voltage supply 34 (Vcc); and logic circuitry 36 (perhaps including a microprocessor) comprising circuitry 38 related to performing conventional smart card operations as well as circuitry 40 to detect the existence of a tamper situation. It will be recognized that the tamper detection circuitry/logic 40 could instead be implemented separately from the conventional smart card operation logic circuitry 38. As a result of a detected tamper situation, tamper detect control signal(s) 42 are generated and applied to the array in order to cause the data stored therein to be destroyed.

Figure 3:
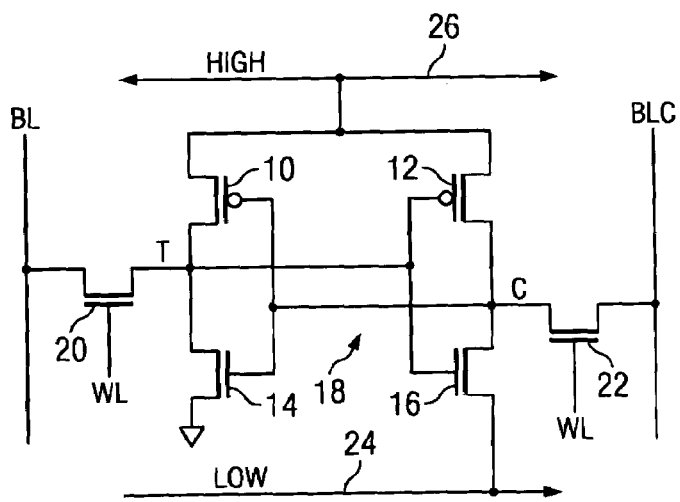
FIG. 3 is a schematic diagram of a 6T memory cell designed to be flash cleared to a zero state.

Reference is now made to FIG. 3 which illustrates a schematic diagram of a 6T memory cell designed to be flash cleared to a zero state (and which may be used in the memory array/device 32 of a smart card such as that shown in FIG. 2). The memory cell includes p-channel transistors 10 and 12, and n-channel transistors 14 and 16. Transistors 10–16 are coupled together as shown in so as to form a pair of cross-coupled logic inverters (latch 18) when the memory cell is configured in a normal mode of operation. The memory cell also includes a pair of pass gate transistors 20 and 22 for providing true (T) and complement (C) data to and from memory cell 1 with respect to a bit line (BL) and complementary bit line (BLC).

A first of the n-channel transistors 14 has its source terminal coupled to a low voltage reference Vss. A second of the n-channel transistors 16 has its source terminal coupled to a low reference power supply line 24. Although illustrated with a connection to the complement side of the latch 18, the low reference power supply line could instead be connected to the true side of the latch. Each of the p-channel transistors 10 and 12 has a source terminal coupled to a high reference power supply line 26. During a normal mode of operation, low power supply line 24 is at the low voltage reference Vss and the high power supply line 26 is at a high voltage reference Vdd (and receives power from either the internal battery supply or an external power supply-Vcc).

With the circuit configuration illustrated, the memory cell supports two methods for using the low power supply line 24 and high power supply line 26 to clear the cell to a zero state (for example, in response to a tamper detection). The two methods are referred to as a "sequential flash clear" and a "gang flash clear." It is assumed for purposes of this discussion that the memory cell shown in FIG. 3 has been replicated in an N×M array to form a memory array/device (such as device 32 in a smart card application).

For the "sequential flash clear" operation, the following events occur to clear each of the memory cells in the memory device to a zero state:

1. Initially, high power supply line 26 is at the high voltage reference Vdd and the low power supply line 24 is at the low voltage reference Vss;

2. Next, the low power supply line 24 is pulled to the high voltage reference Vdd; and 3. Then, the low power supply line 24 is returned to the low voltage reference Vss, which results in the memory cells of the memory device being cleared.

Figure 4A:
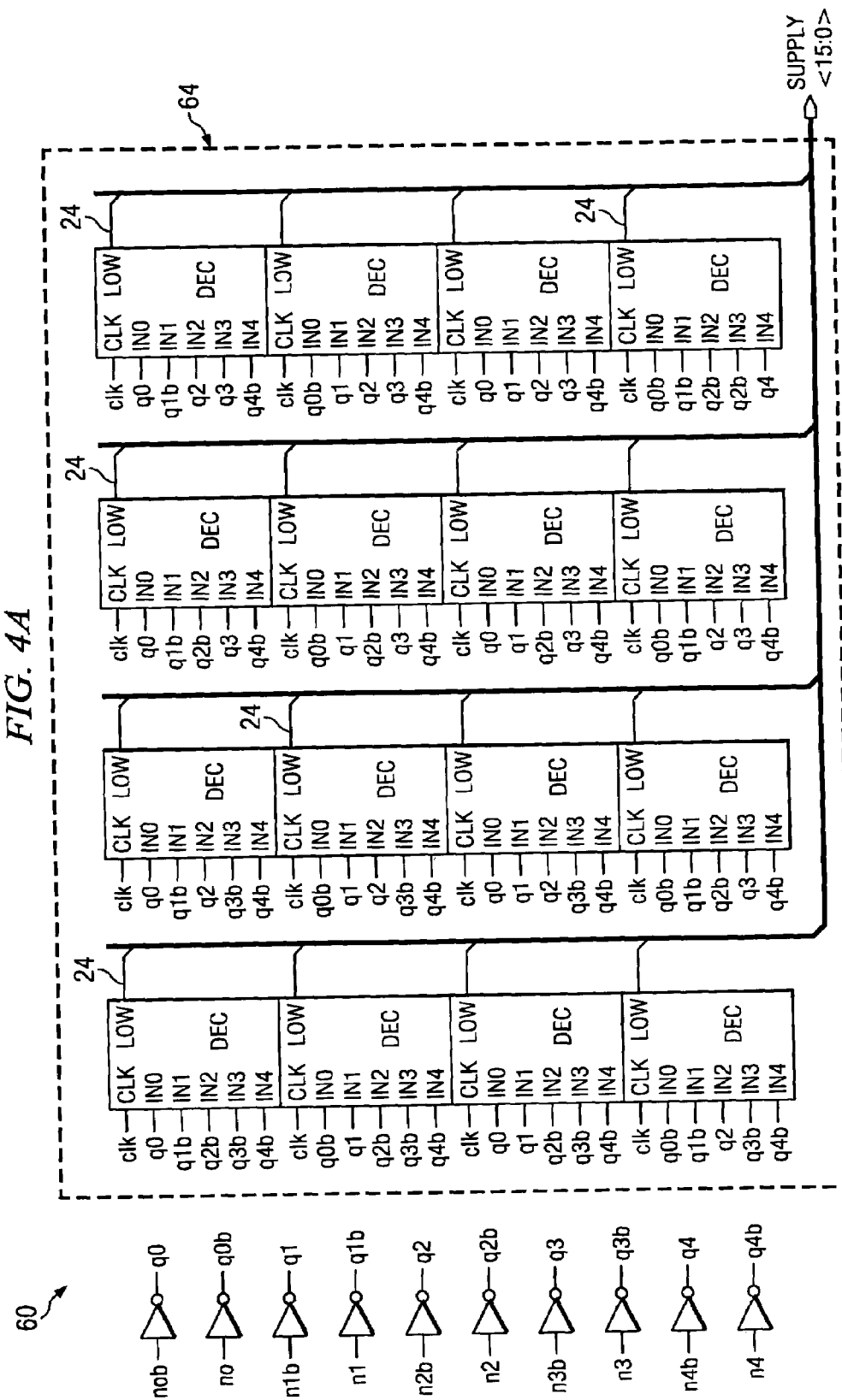
FIGS. 4A and 4B are a schematic and block diagram of a clock and decoder circuit for implementing a sequential flash clear operation for a memory device.
Figure 4B:
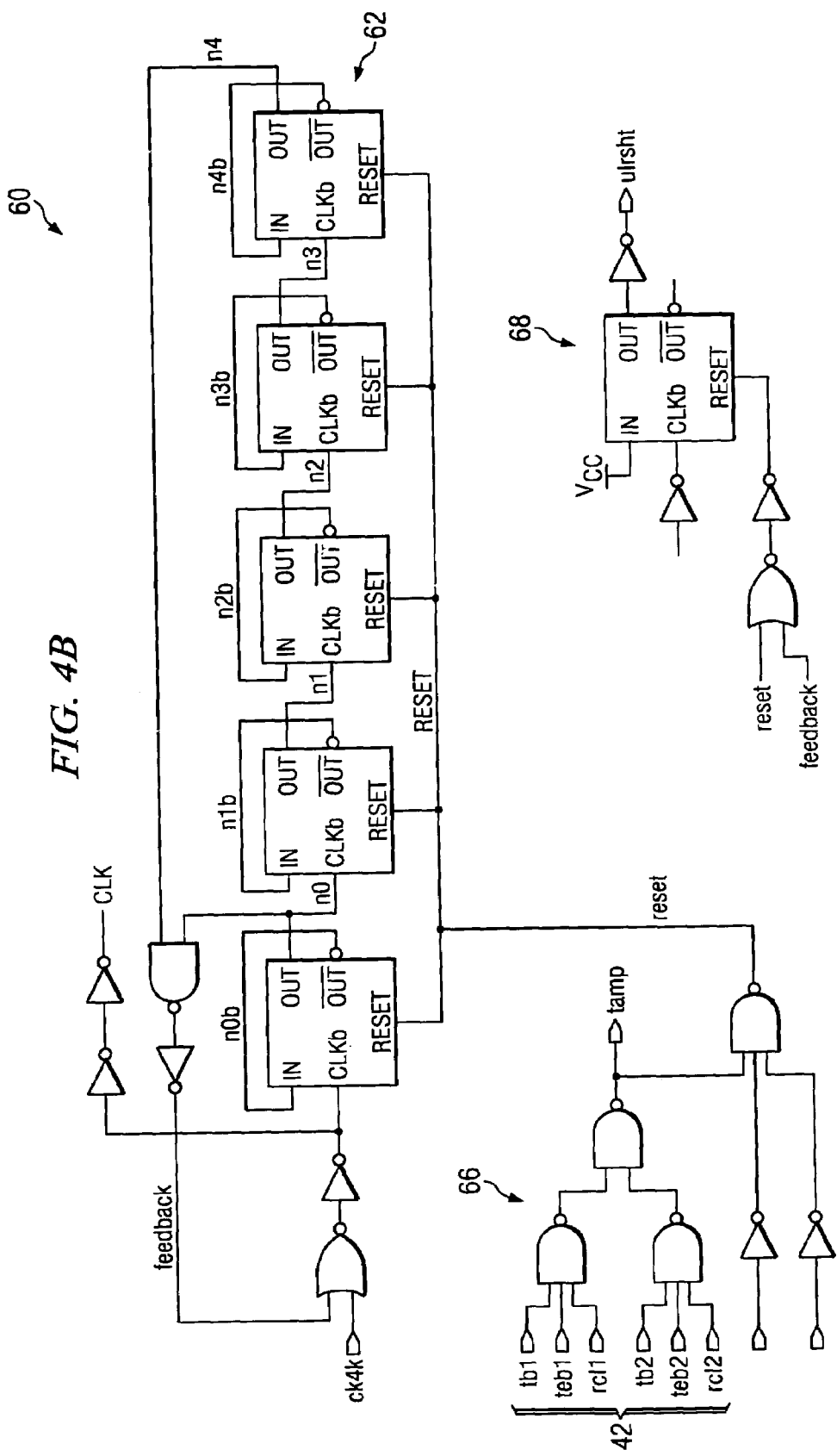

Reference is now made to FIGS. 4A and 4B wherein there is shown a schematic and block diagram of a clock and decoder control circuit 60 for implementing the sequential flash clear operation for a memory device. This clock and decoder control circuit 60 may be located within the memory device or within logic circuitry (such as circuitry 36 and 40) external to the memory device. The memory device includes an N×M array of memory cells like that cell which is illustrated in FIG. 3. As an example, the memory device may comprise a block of 128 bytes of user RAM which is implemented using 32 columns and 32 rows of memory cells. It is understood, however, that the block of 128 memory cell bytes is shown for exemplary purposes only, and that the control circuit 60 can be designed for use to implement a sequential flash clear operation with respect to a memory device of virtually any size.

In the illustrated 32×32 configuration, the low power supply line 24 is preferably shared by a plurality of (for example, two) columns (which may be adjacent) of memory cells. Thus, in the example, there exist 16 separate low power supply lines 24 in a bus SUPPLY<15:0> configuration. A total of 64 memory cells are thus connected to each second power supply line 16 in the SUPPLY bus. In implementing steps 2 and 3 of the sequential flash clear operation, the control circuit 60 sequentially causes each individual power supply line 24 in the SUPPLY bus to momentarily become pulled to the high voltage reference Vdd and then returned to the low voltage reference Vss. With each such voltage control operation, the control circuit 60 causes the 64 memory cells of the memory device which are connected to the controlled power supply line 24 to be cleared.

The control circuit 60 includes a counter 62 comprised of a plurality of D-type flip flops. For the example 32×32 array, five flip flops are used. The flip flops each include a clock input and a data input, and further include a true and complement output. The complement output of a flip flop is connected to the data input of that same flip flop. The true output of one flip flop is connected to the clock input of a next flip flop in the counter 62. A logic AND-gate receives the true outputs of the first and last flip flops to generate a feedback signal to terminate counting when the counter overflows. That feedback signal is logically OR-ed with a clock input ck4k, with the resulting output applied to the clock input of the first flip flop in the counter 62. The clock input ck4k is sourced by a low current oscillator and is used to drive clocking by the counter 62. If the low current oscillator is not running, then the signal ck4k goes to a logic high which prevents the counter 62 from operating. If the oscillator is running, the flip flop count as long as the feedback signal indicates continued counter operation.

The true and complement outputs of each flip flop in the counter 62 are applied to a decode circuit 64. The decode circuit is comprised of a plurality of decoders, one for each power supply line 24 in the SUPPLY bus (and a total of 16 in the example). The decoders are clocked from a clock signal derived from the ck4k signal used by the counter 62. Each individual decoder in the decode circuit 64 receives selected ones of the true and complement outputs of the flip flops in the counter 62 (as shown, these outputs may be buffered/inverted before application to the individual decoders). These signals are decoded to control the logic state of each individual low power supply line 24. More specifically, as the counter 62 increments, the decoder circuit 64 decodes the flip flop outputs and sequentially causes each of the power supply lines 24 in the SUPPLY bus to individually and momentarily become pulled to the high voltage reference Vdd and then returned to the low voltage reference Vss.

Only those memory cells connected to the low power supply line 24 in the SUPPLY bus which is being controlled by the decoder circuit 64 (to undergo a low/high/low voltage transition) have their logic state cleared. Following completion of the counting sequence by the counter 62, each of the low power supply lines 24 in the SUPPLY bus will be controlled to transition low/high/low and all memory cells in the device will have been cleared.

The circuit 60 further includes a reset logic circuit 66. The circuit 66 includes logic gates which receive signals tb1, teb1, rc11 and signals tb2, teb2, rc12. These signals are generated (for example, go to logic high) during a tamper (or other triggering) event. When all of the signals are high, the reset logic circuit generates a control signal which resets the flip flops in the counter 62 to an initial counting state. Although six tamper/trigger signals are illustrated in this exemplary embodiment, it will be understood that a tamper/trigger event could be signaled with fewer signals, even as few as one signal, if desired, and that this would affect the implementation of the logic circuit 66. In any event, with the control signal active, and assuming that the signal ck4k is oscillating, the counter 62 is reset and begins counting and the decoder circuit 64 then sequentially controls the logic states of each of the power supply lines 24 in the SUPPLY bus and cause the sequential flash clear operation to occur.

The circuit 60 further includes a shorting logic circuit 68. The circuit 68 receives at its inputs the reset signal (which is applied to reset the flip flops of the counter 62) and the feedback signal (which is OR-ed with the ck4k clock signal in the counter). These signals are logically OR-ed and applied to reset a D-type flip flop. The output of the D-type flip flop is a shorting control signal that when applied causes a short to be formed around a resistor which is in series with the battery supplying power to the memory device.

The sequential flash clear operation may occur when the system is in a low power mode, such as when the memory device is powered by a battery. This type of flash clear is desirable because it minimizes the current demand placed on the battery. By selectively and sequentially controlling each of the individual power supply lines 24 in the SUPPLY bus, the circuit 60 obviates concerns over placing too high a current demand on the battery as would be the case if the whole block of cells was gang cleared at one time.

For the "gang flash clear" operation, the following events occur to clear each of the memory cells in the memory device to a zero state:

1. Initially, high power supply line 26 is at the high voltage reference Vdd, and low power supply line 24 is at the low voltage reference Vss;

2. Next, high power supply line 26 is pulled to the low voltage reference Vss;

3. Then, low power supply line 24 is pulled to the high voltage reference Vdd;

4. Then, high power supply line 26 is returned to the high voltage reference Vdd; and 5. Finally, low power supply line 24 is returned to the low voltage reference Vss, which results in the memory cells of the memory device being cleared.

Figure 5:
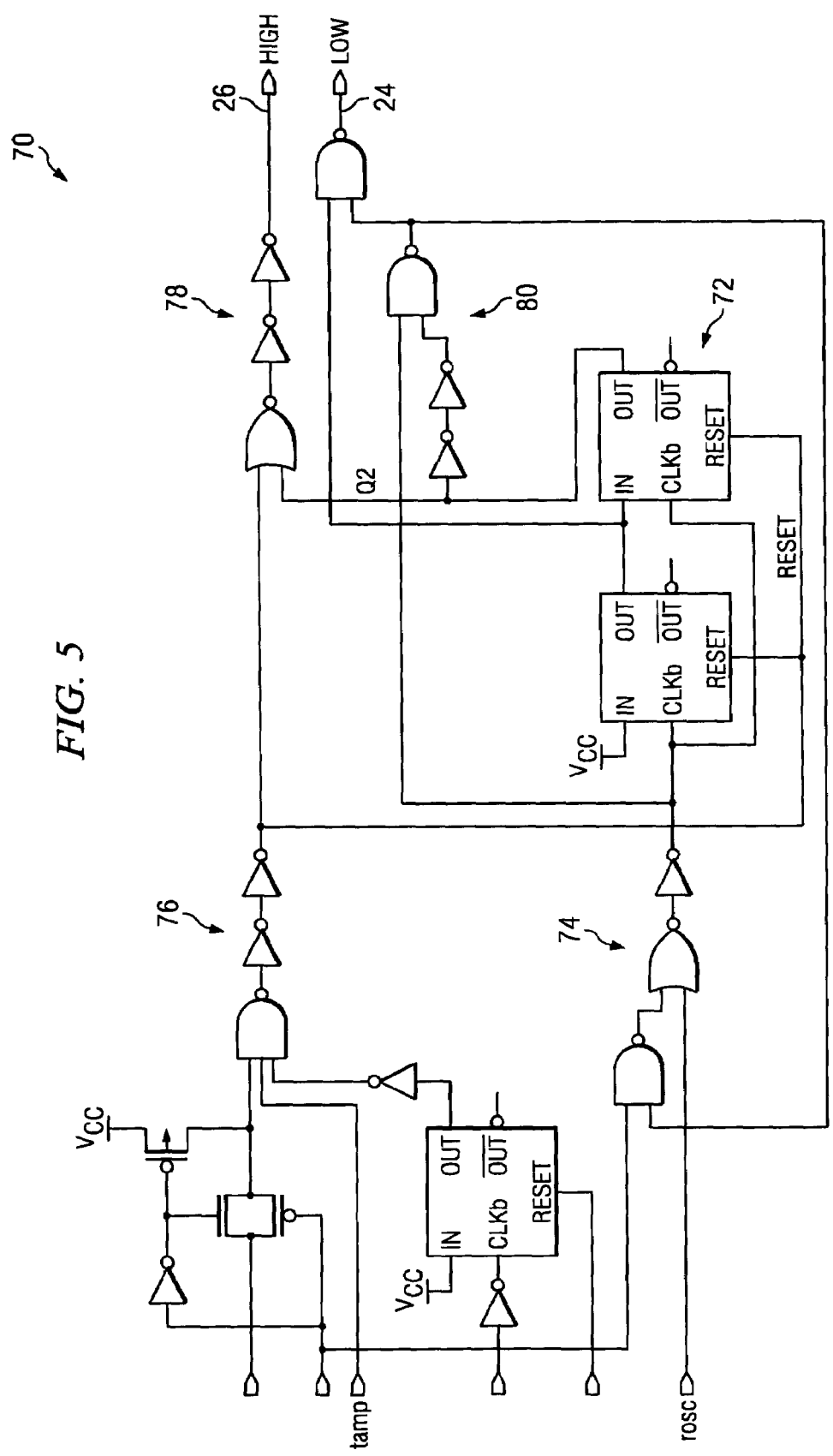
FIG. 5 is a schematic diagram of a control circuit for implementing a gang flash clear operation for a memory device.

Reference is now made to FIG. 5 wherein there is shown a schematic diagram of a control circuit 70 for implementing the gang flash clear for a memory device. This control circuit 70 may be located within the memory device or within logic circuitry (such as circuitry 36 and 40) external to the memory device. The memory device includes an N×M array of memory cells like that cell which is illustrated in FIG. 3. As an example, the memory device may comprise a block of 128 bytes of user RAM which is implemented using 32 columns and 32 rows of memory cells. It is understood, however, that the block of 128 memory cell bytes is shown for exemplary purposes only, and that the control circuit 70 can be designed for use to implement a gang flash clear operation with respect to a memory device of virtually any size.

In the illustrated 32×32 configuration, the low power supply line 24 is preferably shared by a plurality of (for example, two) columns (which may be adjacent) of memory cells so as to additionally enable use of the sequential flash clear operation as described above. However, it will be understood that where only the gang flash clear operation needs to be supported, the low power supply line 24 is preferably shared amongst all of the columns of memory cells (i.e., there is no need for a bus configuration). Assuming that a bus configuration is desired, there exist 16 separate low power supply lines 24 in a bus SUPPLY<15:0> configuration. A total of 64 memory cells are thus connected to each second power supply line 16 in the SUPPLY bus. With respect to the gang flash clear operation, as opposed to the sequential flash clear operation, all of the low power supply lines 24 in the SUPPLY bus are simultaneously and similarly controlled.

In implementing steps 2–5 of the gang flash clear operation, the control circuit 70 sequentially causes the high power supply line 26 to be pulled to the low voltage reference Vss, all low power supply lines 24 in the SUPPLY bus to be pulled to the high voltage reference Vdd, the high power supply line 26 to be returned to the high voltage reference Vdd, and all low power supply lines 24 in the SUPPLY bus to be returned to the low voltage reference Vss. The operation for switching between high power supply line 26 voltage transitions and low power supply line 24 transitions is an interleaved control action. When this sequence of voltage control transition operations is completed by the control circuit 70, all the memory cells in the memory device are cleared.

The circuit 70 receives a tamper signal (tamp) which is generated by the reset logic circuit 66 (see, FIG. 4). The logic gates of the circuit 66 receive signals tb1, teb1, rc11 and signals tb2, teb2, rc12 which are generated (for example, go to logic high) during a tamper (or other triggering) event. When all of the signals are high, the reset logic circuit 66 generates the tamper signal (tamp) for application to the circuit 70. Although six tamper/trigger signals are illustrated in this exemplary embodiment, it will be understood that a tamper/trigger event could be signaled with fewer signals, even as few as one signal, if desired, and that this would affect the implementation of the logic circuit 66.

The circuit further includes a counter 72 comprised of a pair of interconnected D-type flip flops, with operation of the counter 72 driven by a counter logic circuit 74. A reset logic circuit 76 receives the tamper signal and responds thereto by resetting the flip flops of the counter 72 to an initial state. The counter logic circuit 74 generates a clock signal which is applied to the clock input of each flip flop in the counter 72 and which causes the counter to increment. Signal rosc is generated by a ring oscillator and is applied as an input to counter logic circuit 74 to control the sequence of events for effectuating the gang flash clear operation.

The circuit 70 further includes a high power supply line 26 driver circuit 78 which is connected to the high power supply line 26 connected to each memory cell in the memory device. Responsive to the reset signal and the output of the second D-type flip flop in the counter 72, the driver circuit 78 causes the high power supply line 26 to be pulled to the low voltage reference Vss and then, at a later time, causes the high power supply line 26 to be returned to the high voltage reference Vdd. This driver circuit 78 accordingly implements steps 2 and 4 of the gang flash clear operation.

The circuit 70 still further includes a low power supply line 24 driver circuit 80 which is connected to the low power supply line 24 (all lines of the SUPPLY bus, if present) connected to all memory cells in the memory device. Responsive to the outputs of the first and second D-type flip flops in the counter 72, the driver circuit 80 causes all of the low power supply lines 24 in the SUPPLY bus to be pulled to the high voltage reference Vdd and then, at a later time, causes all low power supply lines 24 (in the SUPPLY bus, if present) to be returned to the low voltage reference Vss. This driver circuit 80 accordingly implements steps 3 and 5 of the gang flash clear operation.

The logic of the high power supply line 26 driver circuit 78 and the low power supply line 24 driver circuit 80 is configured, through operation of the counter 72, such that the respective high/low/high and low/high/low voltage reference control operations occur in an interleaved manner so as to properly and timely implement steps 2–5 of the gang flash clear operation.

A gang flash clear operation may occur when the system is not being sourced by a battery and is instead powered by a conventional power source. This type of flash clear is desirable because it can be quickly accomplished and there are no issues or concerns with respect to power demand.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
    a memory array comprising a plurality of memory cells, the plurality of memory cells arranged in a plurality of groups, each memory cell having first and second p-channel transistors and first and second n-channel transistors in a cross-coupled latch configuration; and
    power control circuitry selectively coupled, one group at time, to source terminals of the n-channel transistors in the selected group, for providing to those source terminals a low voltage reference level during a normal mode of operation and transitioning those source terminals to a high voltage reference level and back to the low voltage reference level during a data corruption mode of operation, the power control circuitry comprising:
    a counter;
    a plurality of decoders, one decoder per group, each decoder coupled to receive a count value output from the counter and decode that count value to selectively transition that decoder's connected n-channel source terminal from the low voltage reference level to the high voltage reference level and back to the low voltage reference level.

2. The circuit of claim 1 wherein the source terminal of the other n-channel transistor in each memory cell is always coupled to the low voltage reference.

3. A method for clearing a volatile memory cell, wherein the volatile memory cell is part of a memory array including a plurality of like volatile memory cells, the volatile memory cells arranged in a plurality of groups, comprising:
    counting to produce a count value;
    decoding the count value in association with each group; and
    wherein, for a given group, if the decoding of the count value is true:
    transitioning a low voltage reference terminal for the memory cells for that given group from a low reference voltage associated with a normal mode of operation to a high reference voltage in a data corruption mode of operation; and
    transitioning the low voltage reference terminal for the memory cells for that given group from the high reference voltage back to the low reference voltage.

4. The method of claim 3 wherein the memory cell comprises a 6T memory cell and the low voltage reference terminal comprises a source terminal of one n-channel transistor in a latch portion of the memory cell.

5. The method of claim 4 further comprising holding a source terminal of another n-channel transistor in the latch portion of the memory cell at the low reference voltage.

6. A circuit, comprising:
    a memory array including a plurality of volatile memory cells, the memory cells arranged in a plurality of groups, wherein each volatile memory cell has a low voltage reference terminal; and
    power control circuitry coupled to the volatile memory cells that selectively transitions, one group at a time, the low voltage reference terminal of cells in the selected group, from a low reference voltage associated with a normal mode of operation to a high reference voltage in a data corruption mode of operation and then back from the high reference voltage back to the low reference voltage, the power control circuitry comprising:
    a counter
    a plurality of decoders, one decoder per group, each decoder coupled to receive a count value output from the counter and decode that count value to cause selective transition at the low voltage reference terminal for cells in the selected group.

7. The circuit of claim 6 wherein the volatile memory cell comprises a 6T memory cell and the low voltage reference terminal comprises a source terminal of one n-channel transistor in a latch portion of the memory cell.

8. The circuit of claim 7 wherein a source terminal of another n-channel transistor in the latch is always coupled to the low reference voltage.

9. A method for clearing a volatile memory cell, wherein the volatile memory cell is part of a memory array including a plurality of like volatile memory cells comprising:
    simultaneously transitioning a high voltage reference terminal for all volatile memory cells in the array from a high reference voltage associated with a normal mode of operation to a low reference voltage in a data corruption mode of operation, and then returning the high voltage reference terminal back to the high reference voltage; and
    simultaneously transitioning a low voltage reference terminal for all volatile memory cells in the array from the low reference voltage associated with the normal mode of operation to the high reference voltage in a data corruption mode of operation, and then returning the low voltage reference terminal back to the low reference voltage.

10. The method of claim 9 wherein the memory cell comprises a 6T memory cell and the low voltage reference terminal comprises a source terminal of one n-channel transistor in a latch portion of the memory cell and the high voltage reference terminal comprises a source terminal of at least one p-channel transistor in the latch portion of the memory cell.

11. The method of claim 10 further comprising holding a source terminal of another n-channel transistor in the latch portion of the memory cell at the low reference voltage.

12. The method of claim 9 wherein the steps of transitioning voltage on the low and high voltage reference terminals are performed in an interleaved manner.

13. A circuit, comprising:
a memory array including a plurality of volatile memory cells, wherein each volatile memory cell has a low voltage reference terminal and a high voltage reference terminal; and
power control circuitry coupled to the volatile memory cells, the power control circuitry including voltage driver circuitry operable to simultaneously transition:
   a) the high voltage reference terminal of all cells in the array from a high reference voltage associated with a normal mode of operation to a low reference voltage in a data corruption mode of operation and back to the high reference voltage; and
   b) the low voltage reference terminal of all cells in the array from a low reference voltage associated with a normal mode of operation to a high reference voltage in a data corruption mode of operation and back to the low reference voltage.

14. The circuit of claim 13 wherein the volatile memory cell comprises a 6T memory cell and the low voltage reference terminal comprises a source terminal of one n-channel transistor in a latch portion of the memory cell and the high voltage reference terminal comprises a source terminal of at least one p-channel transistor in the latch portion of the memory cell.

15. The circuit of claim 14 wherein a source terminal of another n-channel transistor in the latch is always coupled to the low reference voltage.

16. The circuit of claim 13 wherein the power control circuitry transitions voltage on the low and high voltage reference terminals in an interleaved manner.

17. A circuit, comprising:
a memory array comprising a plurality of memory cells, each memory cell having first and second p-channel transistors and first and second n-channel transistors in a cross-coupled latch configuration; and
power control circuitry:
   a) coupled to a source terminal of at least one of the p-channel transistors in each of the memory cells within the memory array for providing to those source terminals a high voltage reference level during a normal mode of operation and simultaneously driving those source terminals for all cells in the array to a low voltage reference level and back to the high voltage reference level during a data corruption mode of operation; and
   b) coupled to a source terminal of one of the n-channel transistors in each of the memory cells within the memory array for providing to those source terminal the low voltage reference level during the normal mode of operation and simultaneously driving those source terminals for all cells in the array to the high voltage reference level and back to the low voltage reference level during a data corruption mode of operation.

18. The circuit of claim 17 wherein the source terminal of the other n-channel transistor in each of the memory cells within the memory array is always coupled to the low voltage reference.

19. The circuit of claim 17 wherein the power control circuitry simultaneously transitions voltage across the array on the source terminal of the at least one p-channel transistor and simultaneously transitions voltage across the array on the source terminal of the n-channel transistor in each of the memory cells within the memory array in an interleaved manner.

* * * * *